(12) United States Patent
Okayama

(10) Patent No.: US 12,021,441 B2
(45) Date of Patent: Jun. 25, 2024

(54) SWITCHING CONTROL CIRCUIT, DRIVE CONTROL DEVICE, AND SWITCHING CONTROL METHOD

(71) Applicant: FUJI ELECTRIC CO., LTD., Kawasaki (JP)

(72) Inventor: Kenichi Okayama, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 322 days.

(21) Appl. No.: 17/484,675

(22) Filed: Sep. 24, 2021

(65) Prior Publication Data
US 2022/0014087 A1 Jan. 13, 2022

Related U.S. Application Data

(63) Continuation of application No. PCT/JP2020/032077, filed on Aug. 25, 2020.

(30) Foreign Application Priority Data

Oct. 11, 2019 (JP) .................................. 2019-187442

(51) Int. Cl.
*H02M 1/08* (2006.01)
*H02M 1/32* (2007.01)
(Continued)

(52) U.S. Cl.
CPC ............ *H02M 1/08* (2013.01); *H02P 29/027* (2013.01); *H03K 17/04126* (2013.01)

(58) Field of Classification Search
CPC ........ H02M 7/5387; H02M 1/08; H02M 1/32; H02M 1/0009; H02P 29/027; H03K 17/0828; H03K 17/04126
(Continued)

(56) References Cited

U.S. PATENT DOCUMENTS 10,770,888 B2 * 9/2020 Minagawa ......... H03K 17/0828
2004/0196678 A1 * 10/2004 Yoshimura ........... H03K 17/168
363/79
(Continued)

FOREIGN PATENT DOCUMENTS

JP 2004-260981 A 9/2004
JP 2004-304527 A 10/2004
(Continued)

OTHER PUBLICATIONS

International Search Report for PCT/JP2020/032077, dated Nov. 10, 2020.

*Primary Examiner* — Gabriel Agared
(74) *Attorney, Agent, or Firm* — Rabin & Berdo, P.C.

(57) ABSTRACT

A switching control circuit configured to control switching of a first switching device of a bridge circuit. The bridge circuit includes the first switching device on a power supply side thereof, and a second switching device on a ground side thereof and being coupled to the first switching device in series through a load. The switching control circuit includes an output circuit configured to delay a first drive signal inputted to the switching control circuit for turning off the first switching device for a predetermined period, and output a resultant signal, when a current flowing through the second switching device becomes an overcurrent and the second switching device is turned off, and a drive circuit configured to drive the first switching device in response to an output of the output circuit.

6 Claims, 10 Drawing Sheets

(51) Int. Cl.
*H02P 29/024* (2016.01)
*H03K 17/0412* (2006.01)

(58) Field of Classification Search
USPC .......................................................... 318/103
See application file for complete search history.

(56) References Cited

U.S. PATENT DOCUMENTS

| | | | | |
|---|---|---|---|---|
| 2012/0217937 | A1* | 8/2012 | Miyauchi | H03K 17/0828 |
| | | | | 327/109 |
| 2013/0271876 | A1* | 10/2013 | Hosotani | H02M 1/36 |
| | | | | 361/18 |
| 2015/0188410 | A1* | 7/2015 | Takagiwa | H02M 7/537 |
| | | | | 363/56.02 |
| 2017/0170820 | A1* | 6/2017 | Nakamori | H03K 17/08116 |
| 2018/0294709 | A1* | 10/2018 | Araki | H03K 17/161 |
| 2019/0280616 | A1* | 9/2019 | Tanabe | H02M 7/5387 |

FOREIGN PATENT DOCUMENTS

| | | |
|---|---|---|
| JP | 2005-033678 A | 2/2005 |
| JP | 2006-203415 A | 8/2006 |
| JP | 2007-312504 A | 11/2007 |
| JP | 5673449 B2 | 2/2015 |

* cited by examiner

SWITCHING CONTROL CIRCUIT, DRIVE CONTROL DEVICE, AND SWITCHING CONTROL METHOD

CROSS-REFERENCE TO RELATED APPLICATIONS

This is a continuation application of International Patent Application No. PCT/JP2020/032077 filed Aug. 25, 2020, which claims the benefit of priority to Japanese Patent Application No. 2019-187442 filed Oct. 11, 2019, the entire contents of each of which the entire contents of each of which are incorporated herein by reference.

BACKGROUND

Technical Field

The present disclosure relates to a switching control circuit, a drive control device, and a switching control method.

Description of the Related Art

There are switching control circuits that control switching of switching devices (for example, Japanese Patent Application Publication No. 2004-304527).

In some cases, a drive unit that drives multiple switching devices for driving a three-phase motor turns off a switching device of a lower arm and then turns off a switching device of an upper arm, in order to interrupt an overcurrent caused by a load short-circuit. In this case, a voltage generated in the switching device of the upper arm may damage the switching device of the upper arm.

The present disclosure is directed to provision of a switching control circuit, a drive control device, and a switching control method that are capable of preventing a switching device of an upper arm from being damaged.

SUMMARY

A first aspect of the present disclosure is a switching control circuit configured to control switching of a first switching device of a bridge circuit, the bridge circuit including the first switching device on a power supply side thereof, and a second switching device on a ground side thereof and being coupled to the first switching device in series through a load, the switching control circuit comprising: an output circuit configured to delay a first drive signal inputted to the switching control circuit for turning off the first switching device for a predetermined period, and output a resultant signal, when a current flowing through the second switching device becomes an overcurrent and the second switching device is turned off; and a drive circuit configured to drive the first switching device in response to an output of the output circuit.

A second aspect of the present disclosure is a drive control device comprising: a first switching device on a power supply side; a second switching device on a ground side, and being coupled to the first switching device in series through a load; a control circuit configured to output a control signal for controlling the first switching device and the second switching device; a high-voltage drive circuit; and a low-voltage drive circuit, wherein the high-voltage drive circuit is configured to drive the first switching device in response to the control signal, the low-voltage drive circuit is configured to drive the second switching device in response to the control signal, and the control circuit includes a counter configured to count a predetermined period of time, responsive to a current flowing through the second switching device becoming an overcurrent, and a signal output circuit configured to output the control signal for turning off the second switching device to the low-voltage drive circuit, responsive to the current becoming the overcurrent, and output the control signal for turning off the first switching device to the high-voltage drive circuit, responsive to the counter having counted the predetermined period of time.

A third aspect of the present disclosure is a switching control method of controlling switching of a first switching device of a bridge circuit, the bridge circuit including the first switching device on a power supply side thereof, and a second switching device on a ground side thereof, the first and second switching devices being coupled in series through a load, the switching control method comprising: turning off the second switching device, responsive to a current flowing through the second switching device becoming an overcurrent, and turning off the first switching device after a lapse of a predetermined period of time, responsive to the current becoming the overcurrent.

DETAILED DESCRIPTION

At least following matters will become apparent from the descriptions of the present specification and the accompanying drawings.

Embodiments

Figure 1:
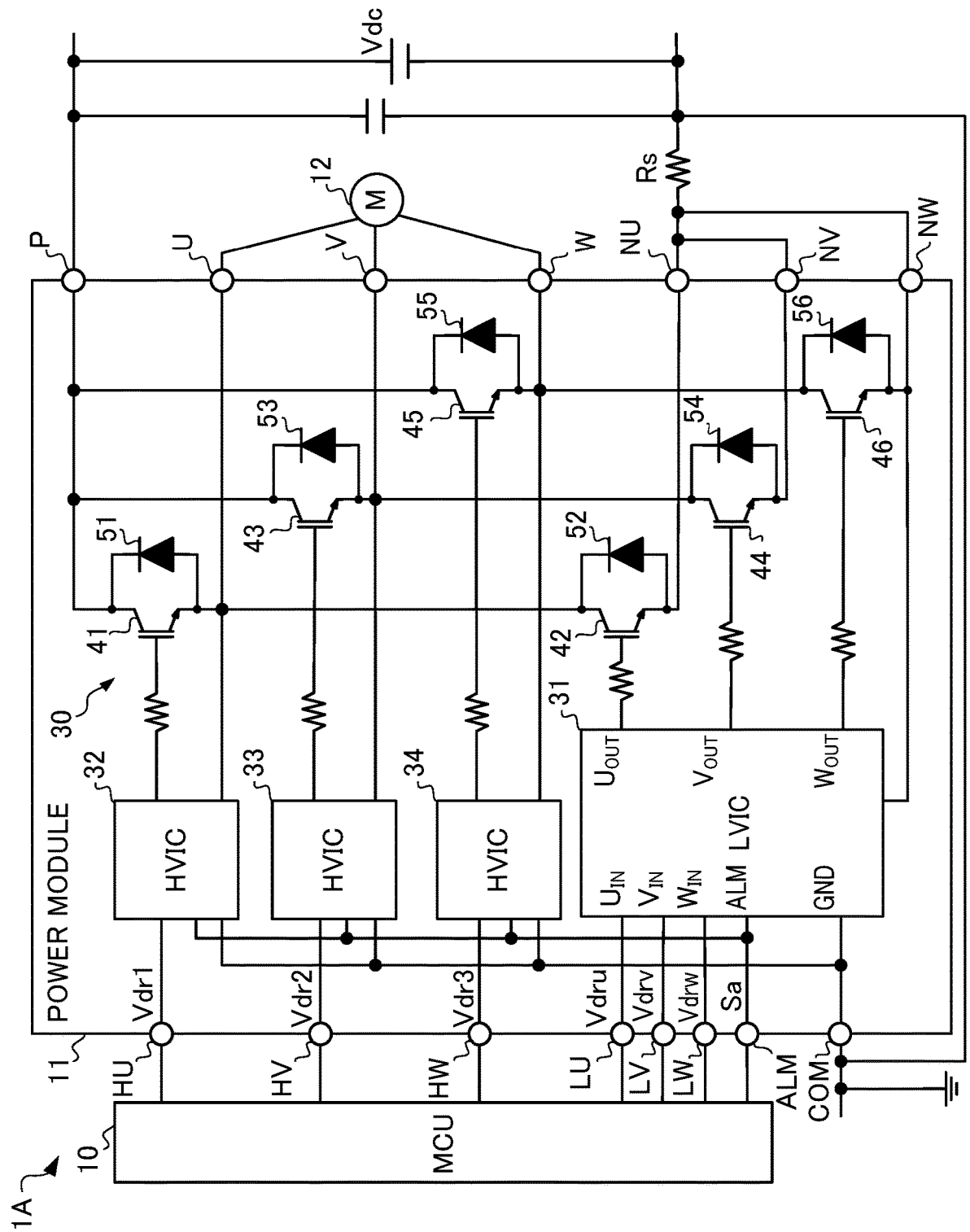
FIG. 1 is a diagram illustrating configurations of a micro control unit (MCU) 10 and a power module 11.

FIG. 1 is a diagram illustrating configurations of a micro control unit (MCU) 10 and a power module 11 which is one embodiment of the present disclosure.

<<<Description of MCU 10>>>

The control circuit (for example, MCU) 10 outputs drive signals Vdr1, Vdr2, Vdr3, Vdru, Vdrv, and Vdrw to control the power module 11 according to a user's instruction and/or the like. The MCU 10 receives an ALM signal Sa indicating whether a current flowing through a resistor Rs (described later) is an overcurrent, from a low-voltage drive circuit 31 (hereinafter, referred to as low-voltage integrated circuit (LVIC) 31) (described later).

Upon receiving the ALM signal Sa indicating that the current flowing through the resistor Rs is the overcurrent, the MCU 10 sequentially outputs the drive signals Vdr1 to Vdr3 to turn off insulated gate bipolar transistors (IGBTs) of an upper arm among IGBTs 41 to 46, and the drive signals Vdru to Vdrw to turn off IGBTs of a lower arm among the IGBTs 41 to 46.

<<<Description of Power Module 11>>>

The power module 11 is a semiconductor device configured to drive a three-phase motor 12, and includes a bridge circuit 30 for power conversion, the LVIC 31, high-voltage drive circuits 32 to 34 (hereinafter, high-voltage integrated circuits (HVICs) 32 to 34), and terminals HU, HV, HW, LU, LV, LW, ALM, P, U, V, W, NU, NV, NW, and COM.

The bridge circuit 30 includes the IGBTs 41 to 46 that drive the three-phase motor 12 and free wheeling diodes (FWDs) 51 to 56.

The IGBTs 41 and 42 are U-phase switching devices and are provided with the FWDs 51 and 52, respectively. The IGBTs 43 and 44 are V-phase switching devices and are provided with the FWDs 53 and 54, respectively. The IGBTs 45 and 46 are W-phase switching devices and are provided with the FWDs 55 and 56, respectively.

Note that, in an embodiment of the present disclosure, the IGBTs 41 to 46 are used as the switching devices of the power module 11, however, the switching devices may be, for example, power metal-oxide-semiconductor (MOS) transistors. In such a case, the FWDs 51 to 56 are body diodes.

The resistor Rs detects a current flowing in the bridge circuit 30. A power supply voltage Vdc is applied to the terminal P, the three-phase motor 12, which is a load, is provided at the terminals U, V, and W, and the terminals NU, NV, and NW are grounded through the resistor Rs.

The LVIC 31 is an integrated circuit for switching the IGBTs 42, 44, and 46 of the lower arm in response to the drive signals Vdru, Vdrv, and Vdrw received through the terminals LU, LV, and LW, respectively. The LVIC 31 includes a comparator (described later) that detects the current flowing through the resistor Rs and generates the ALM signal Sa.

Note that, for example, the ALM signal Sa is at a low level (hereinafter, referred to as low or low level) when the current flowing through the resistor Rs is the overcurrent, and the ALM signal Sa is at a high level (hereinafter, referred to as high or high level) when the current flowing through the resistor Rs is not the overcurrent The HVICs 32 to 34 are integrated circuits that control switching of the IGBTs 41, 43, and 45 of the upper arm, respectively, in response to the drive signals Vdr1, Vdr2, and Vdr3 received through the terminals HU, HV, and HW, and the ALM signal Sa from the LVIC 31.

The bridge circuit 30 usually passes a current through three coils (not illustrated) in the three-phase motor 12 to rotate the three-phase motor 12. Specifically, the bridge circuit 30 passes a current through different coils by switching combinations of the IGBTs 41, 43, and 45 of the upper arm and the IGBTs 42, 44, and 46 of the lower arm coupled to the terminals U, V, and W.

For example, upon simultaneously turning on of the U-phase IGBT 41 of the upper arm and the V-phase IGBT 44 of the lower arm, the current flows from the terminal U to the terminal V through a coil in the three-phase motor 12. Since the same applies to other combinations between phases, a description thereof is omitted. The bridge circuit 30 thereby outputs drive currents whose phases are shifted from one another, for example, by 120 degrees from the terminals U, V, and W, and thus the three-phase motor 12 rotates at speed corresponding to the drive currents.

<<<Path of Overcurrent in Bridge Circuit 30>>>

Figure 2:
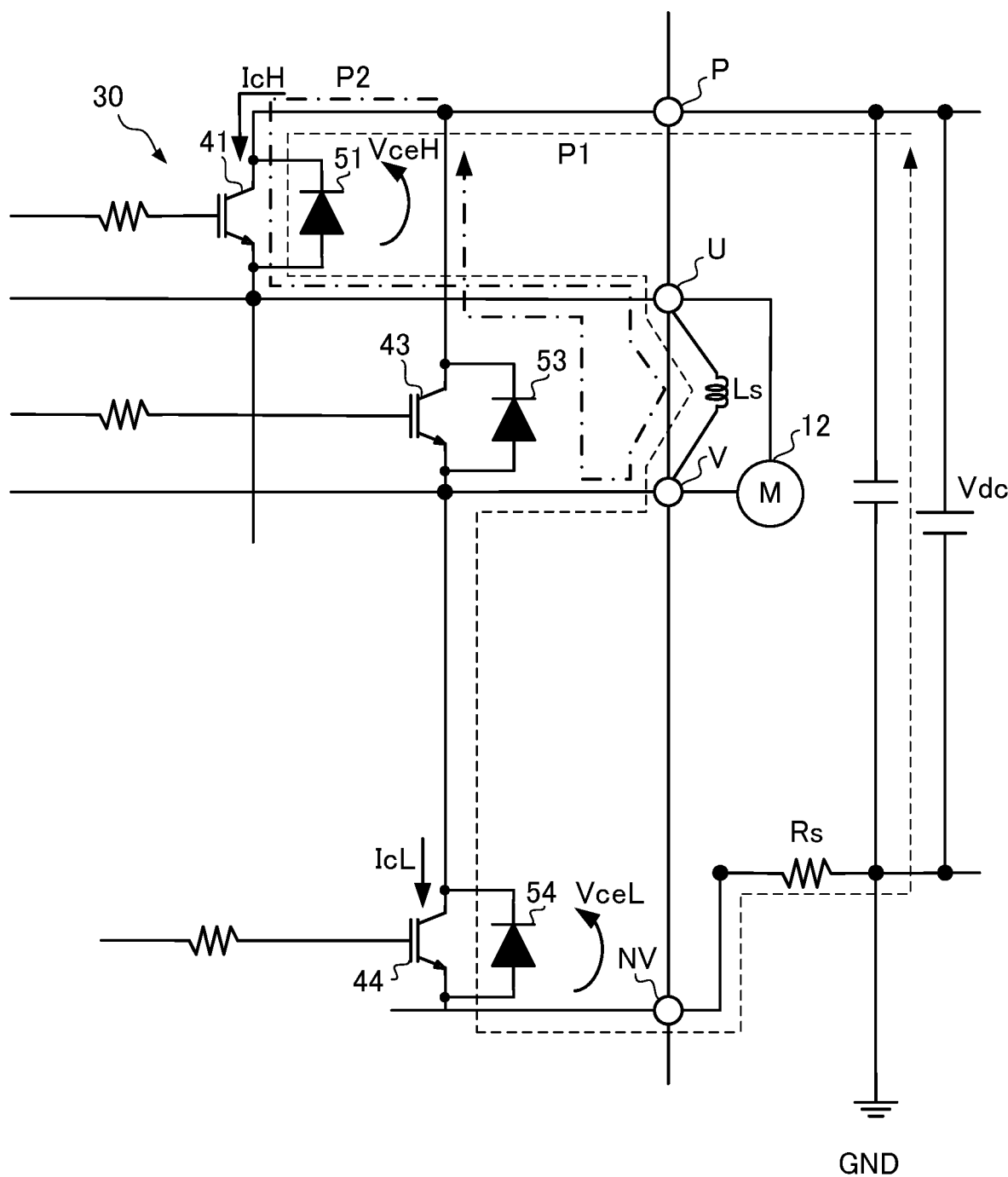
FIG. 2 is a diagram illustrating an example of a path of an overcurrent flowing in a bridge circuit 30.

FIG. 2 is a diagram illustrating an example of a path of the overcurrent flowing in the bridge circuit 30. FIG. 2 illustrates only the elements that are needed to describe the path of the overcurrent.

With dirt and/or dust adhering in the vicinity of a current path between any two of the terminals U, V, and W, a conductive path with very low inductance Ls is created, resulting in an occurrence of a load short-circuit between the two of the terminals U, V, and W. Due to the load-circuit occurred as such, the overcurrent flows through the IGBTs that drive the motor through the two of the terminals U, V, and W.

A path P1 (given by a dotted line) of the overcurrent in FIG. 2 is, for example, a path of the overcurrent created when a load short-circuit occurs between the terminal U and the terminal V. When a load short-circuit occurs between other terminals, the overcurrent flows through a path different therefrom. However, since the principle of how such overcurrent flows is the same as the principle of how the overcurrent caused by the load short-circuit flows between the terminals U and V, a description thereof is omitted.

A description will be given below of the path P1 and a path P2 (given by a dashed-dotted line) of the overcurrent in the case where a load short-circuit occurs between the terminals U and V.

In some cases, the LVIC 31 and the HVIC 32 simultaneously turn on the U-phase IGBT 41 of the upper arm and the V-phase IGBT 44 of the lower arm that are coupled to each other through the three-phase motor 12, respectively, to drive the three-phase motor 12. In such a case, when a load short-circuit occurs between the terminal U and the terminal V, the overcurrent flows along the path P1 from the power supply side to the ground side through the very low inductance Ls.

When the LVIC 31 detects the overcurrent at the resistor Rs, the LVIC 31 turns off the IGBT 44, and details will be described later. When the IGBT 44 is turned off, a current IcL flowing through the IGBT 44 is interrupted. As a result, the path through which the overcurrent flows changes from the path P1 to the path P2. In this case, the overcurrent is converted into heat while flowing through the FWD 53 and the amount of the overcurrent decreases over time.

Thereafter, upon receiving the drive signal Vdr1 for turning off the U-phase IGBT 41 of the upper arm from the MCU 10, the HVIC 32 turns off the IGBT 41. Then, the overcurrent caused by a load short-circuit is interrupted.

The overcurrent is caused often by a short circuit between upper and lower arms (load short-circuit) as described above, and the overcurrent is generally ten to several tens of times the rated current of the IGBT 41. Thus, when the HVIC 32 turns off the IGBT 41, di/dt in interruption is generally steep.

A voltage peak VCEP generated between a collector and an emitter of the IGBT 41 when the HVIC 32 turns off the IGBT 41 is expressed by the following formula using di/dt in turning-off, the very low inductance Ls, and the upper and lower arm power supply voltage Vdc.

$$VCEP = Vdc + Ls \times di/dt \qquad (1)$$

For example, when Vdc=400 V, Ls=100 nH, and di/dt=3 kA/us, VCEP=700 V. In this case, when the absolute maximum rating of the IGBT 41 is 600 V, the voltage peak VCEP results in a voltage exceeding the absolute maximum rating of the collector-emitter voltage of the IGBT 41.

Note that the IGBT 41 corresponds to a "first switching device", the IGBT 44 corresponds to a "second switching device", and the three-phase motor 12 corresponds to a "load". In addition, the bridge circuit 30 corresponds to a "bridge circuit".

Furthermore, the FWD 53 corresponds to a "free wheeling diode". In this description, "couple" means electrical coupling, and includes cases where another element(s) is/are included between coupled elements.

A detailed description will be given of the LVIC 31, the HVICs 32 to 34, and the like that are provided in the power module 11 to protect the IGBTs of the upper arms when the overcurrent flows.

<<Configuration of LVIC 31>>

Figure 3:
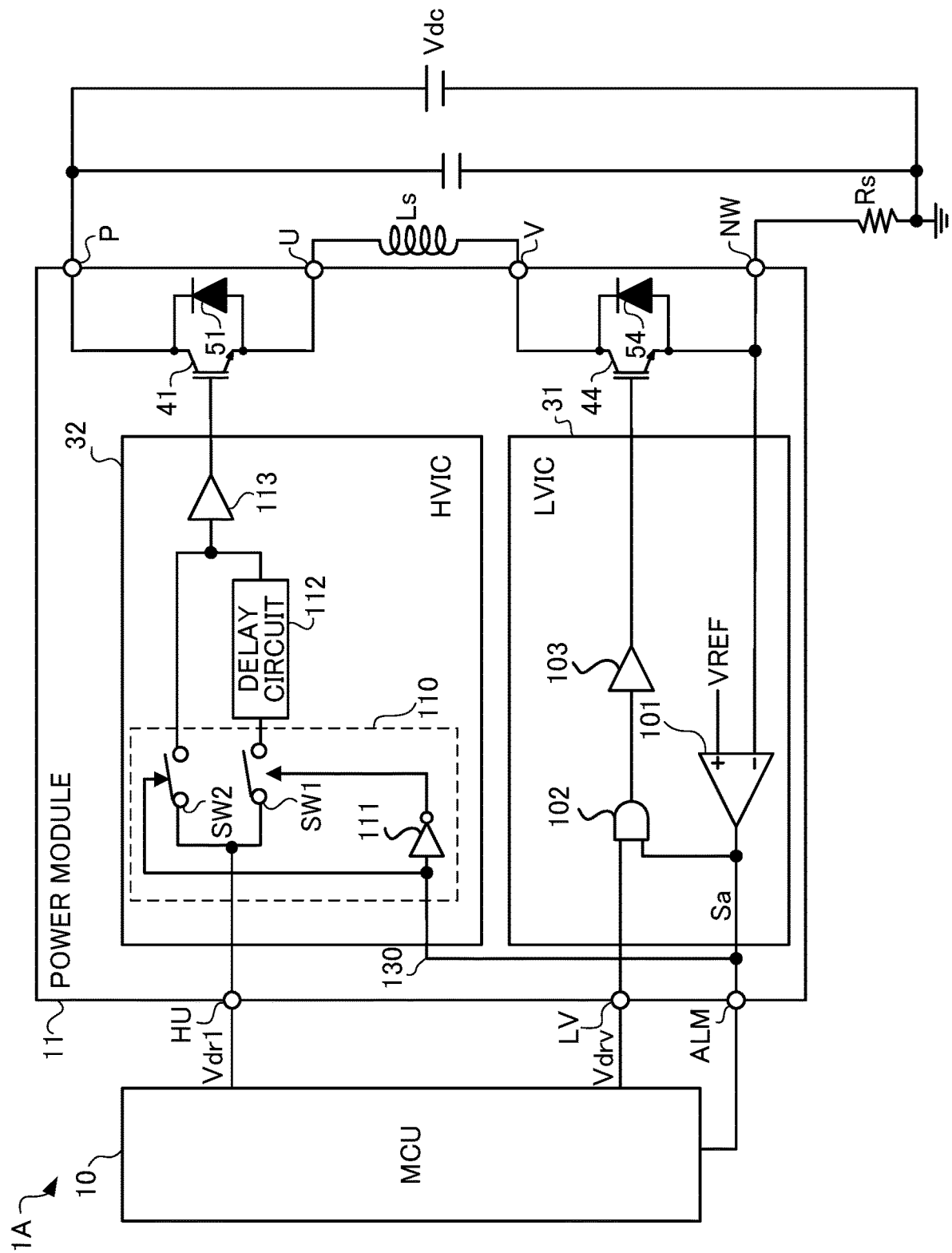
FIG. 3 is a diagram illustrating an example of a configuration of a high-voltage integrated circuit (HVIC) 32.

The LVIC 31 of FIG. 3 drives the U-phase IGBT 42, the V-phase IGBT 44, and the W-phase IGBT 46 of the lower arm, and detects the current flowing through the resistor Rs to thereby generate the ALM signal Sa indicating whether the current flowing through the resistor Rs is the overcurrent.

Here, a circuit that drives the IGBT 44 among the IGBTs 42, 44, and 46 will be described, and a description of other circuits is omitted for the sake of convenience.

The LVIC 31 includes a comparator 101, an AND element 102, and a buffer 103. The comparator 101 generates the ALM signal Sa. The AND element 102 and the buffer 103 configures a circuit to drive the V-phase IGBT 44 of the lower arm.

The comparator 101 generates the ALM signal Sa by detecting a voltage VRs on the LVIC 31 side of the resistor Rs. When the voltage VRs exceeds a threshold voltage VREF, the comparator 101 outputs, for example, a low signal indicating that the current in the IGBTs 41 and 44 is the overcurrent.

Meanwhile, when the voltage VRs does not exceed the threshold voltage VREF, the comparator 101 outputs a high signal indicating that the current in the IGBTs 41 and 44 is not the overcurrent. The threshold voltage VREF is determined based on an overcurrent determination threshold. The ALM signal Sa is directly inputted to the MCU 10 and the HVIC 32 through wiring 130.

The AND element 102 receives the drive signal Vdry from the MCU 10 and the output of the comparator 101. When the output of the comparator 101 is high, the AND element 102 outputs the drive signal Vdry to the buffer 103. When the output of the comparator 101 is low, the AND element 102 outputs a low signal to the buffer 103.

As a result, when the output of the comparator 101 is high and does not indicate the overcurrent, the AND element 102 outputs, to the buffer 103, the drive signal Vdry for driving the V-phase IGBT 44 of the lower arm. The buffer 103 drives the V-phase IGBT 44 of the lower arm in response to the output of the AND element 102. Note that the comparator 101 corresponds to a "detection circuit".

<<<Configuration of HVIC 32>>>

When the ALM signal Sa is high and indicates that the current is not the overcurrent, the HVIC 32 of FIG. 3 outputs the drive signal Vdr1 for switching the IGBT 41. Meanwhile, when the ALM signal Sa is low and indicates that the current is the overcurrent, the HVIC 32 delays the drive signal Vdr1 for turning off the IGBT 41 and outputs a resultant signal.

The HVIC 32 includes a selection circuit 110, a delay circuit 112, and a drive circuit 113. The same applies to the HVICs 33 and 34, a description thereof is omitted.

Note that the HVIC 32 corresponds to a "switching control circuit", the drive signal Vdr1 for turning off the IGBT 41 corresponds to a "first drive signal", and the drive signal Vdr1 for switching the IGBT 41 corresponds to a "second drive signal".

<<Selection Circuit 110>>

The selection circuit 110 outputs the drive signal Vdr1 for turning off the IGBT 41 to the delay circuit 112 (described later) when the ALM signal Sa is low, and outputs the drive signal Vdr1 to the drive circuit 113 (described later) when the ALM signal Sa is high.

Further, the selection circuit 110 includes a switch SW1 that outputs the drive signal Vdr1 to the delay circuit 112, a switch SW2 that outputs the drive signal Vdr1 to the drive circuit 113, and an inverter 111.

When the ALM signal Sa is low, the switch SW1 is turned on and the switch SW2 is turned off. As a result, the drive signal Vdr1 is outputted to the delay circuit 112. In contrast, when the ALM signal Sa is high, the switch SW2 is turned on and the switch SW1 is turned off. As a result, the drive signal Vdr1 is outputted to the drive circuit 113.

The selection circuit 110 is coupled to an output of the comparator 101 in the LVIC 31 through the wiring 130. This enables the selection circuit 110 to switch between the switch SW1 and the switch SW2 without being controlled by the MCU 10. Note that the ALM signal Sa corresponds to a "signal indicating whether the current is the overcurrent".

<<Delay Circuit 112>>

Figure 4:
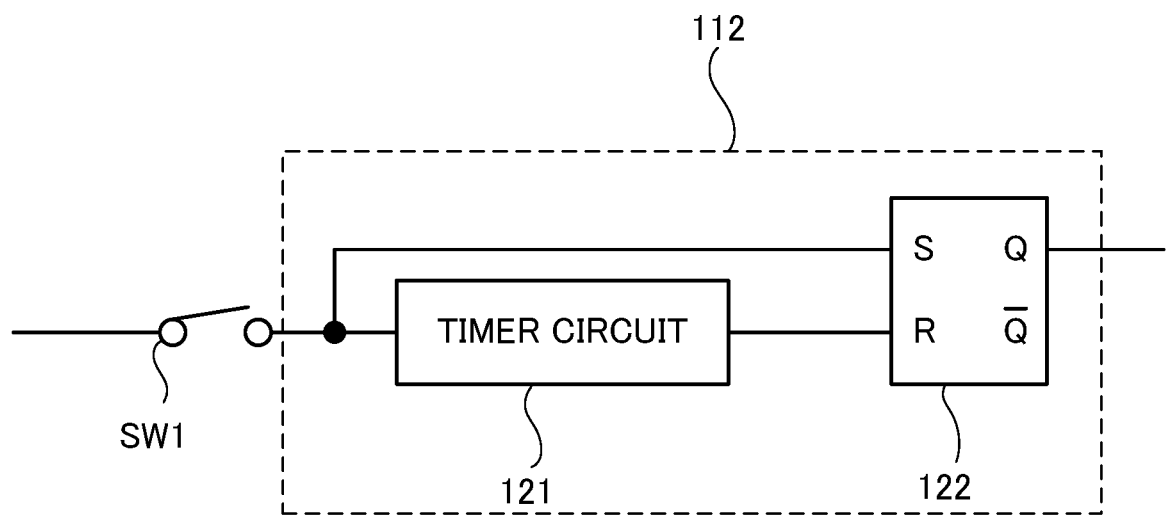
FIG. 4 is a diagram illustrating an example of a configuration of a delay circuit 112.

The delay circuit 112 delays the low drive signal Vdr1, which is a signal for the MCU 10 to instruct to turn off the IGBT 41, for a predetermined period of time Ta, and outputs a resultant signal. FIG. 4 is a diagram illustrating an example of a configuration of the delay circuit 112. As illustrated in FIG. 4, the delay circuit 112 includes a timer circuit 121 and an SR flip-flop 122. The timer circuit 121 counts the predetermined period of time Ta from the falling edge of the drive signal Vdr1, and outputs a high signal upon completion of the counting.

The SR flip-flop 122 has an S input to receive the drive signal Vdr1, an R input coupled to an output of the timer circuit 121, and a Q output coupled to the drive circuit 113 (described later). Thus, only the drive signal Vdr1 that is low is delayed for the predetermined period of time Ta.

The predetermined period of time Ta is set so as to satisfy Ta≥T1, where T1 is a first period of time from when the drive signal Vdr1 goes low until when a current IcH flowing through the IGBT 41 drops below the overcurrent.

Moreover, the predetermined period of time Ta is set so as to satisfy Ta≥T2, where T2 is a second period of time from when the drive signal Vdr1 goes low to when a voltage VceH applied to the IGBT 41 reaches a voltage value that does not exceed the absolute maximum rating of the collector-emitter voltage of the IGBT 41.

Furthermore, the predetermined period of time Ta is set so as to satisfy Ta≥T3, where T3 is a third period of time from when the drive signal Vdr1 goes low to when the current IcH drops below a current value at which avalanche breakdown of the IGBT 41 occurs.

In addition, the predetermined period of time Ta may be set according to a value stored in a storage device (for example, erasable programmable read only memory (EPROM) and/or the like) not illustrated. Note that the selection circuit 110 corresponds to a "selection circuit", the delay circuit 112 corresponds to a "delay circuit", and a combination of the selection circuit 110 and the delay circuit 112 corresponds to an "output circuit".

<<Drive Circuit 113>>

The drive circuit 113 drives the IGBT 41 in response to an output of the selection circuit 110 or an output of the delay circuit 112. Note that the drive circuit 113 corresponds to a "drive circuit".

<<<Operation of Power Module 11>>>

Figure 5:
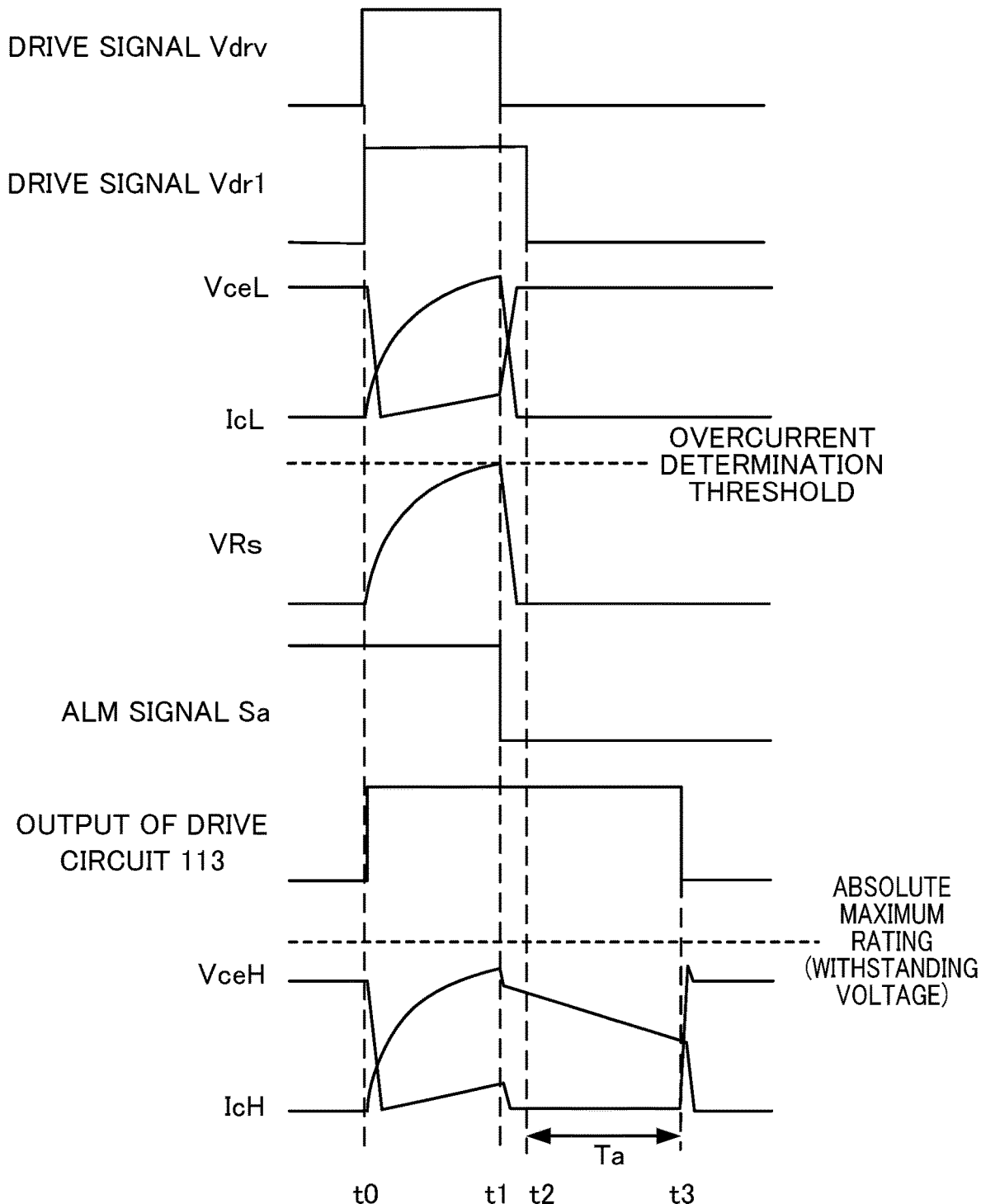
FIG. 5 is a diagram for explaining an operation of a power module 11.

FIG. 5 is a diagram for explaining an operation of the power module 11 in the case where a load short-circuit occurs between the U terminal and the V terminal of the power module 11. A description will be given with reference to FIGS. 2 and 3.

The drive signals Vdr1 and Vdry in FIG. 5 indicate signals for driving the IGBTs 41 and 44, respectively.

At time t0, the drive signal Vdr1 and Vdry for turning on the IGBTs 41 and 44, respectively, go high. Then, with turning-on of the IGBTs 41 and 44, voltages VceH and VceL drop to low, the voltages VceH and VceL being collector-emitter voltages of the IGBTs 41 and 44, respectively. In addition, the current IcH flowing through the IGBT 41 and the current IcL flowing through the IGBT 44 increase.

In this case, since the current IcH and the current IcL flow through the resistor Rs along the path P1, the voltage VRs on the LVIC 31 side of the resistor Rs starts to increase.

Between time t0 and time t1, the voltage VceL gradually increases due to the current IcL flowing through the IGBT 44 and an on resistance of the IGBT 44. Similarly, the voltage VceH gradually increases due to the current IcH flowing through the IGBT 41 and an on resistance of the IGBT 41.

When the voltage VRs reaches the overcurrent determination threshold at time T1, the comparator 101 in the LVIC 31 changes the ALM signal Sa to low.

Since the ALM signal Sa is low, the switch SW1 of the selection circuit 110 is turned on, the switch SW2 is turned off, and thus the selection circuit 110 outputs the drive signal Vdr1 to the delay circuit 112.

When the low ALM signal Sa is outputted to the MCU 10 and processing time in the MCU 10 has elapsed at time t2, the MCU 10 changes the drive signal Vdr1 to low and outputs the drive signal Vdr1 to the HVIC 32.

Then, the timer circuit 121 of the delay circuit 112 counts the predetermined period of time Ta from the falling edge of the low drive signal Vdr1, and delays the low drive signal Vdr1. As a result, the timing of turning-off of the IGBT 41 is delayed as given by the output of the drive circuit 113.

Between time t2 and time t3, the overcurrent is converted into heat in the FWD 53, thereby decreasing.

At time t3, at which the predetermined period of time Ta has elapsed since time t2, the HVIC 32 turns off the IGBT 41. Here, since the predetermined period of time Ta>T1, T2, and T3, the IGBT 41 can be prevented from being damaged.

<<<Configuration of HVIC 200>>>

Figure 6:
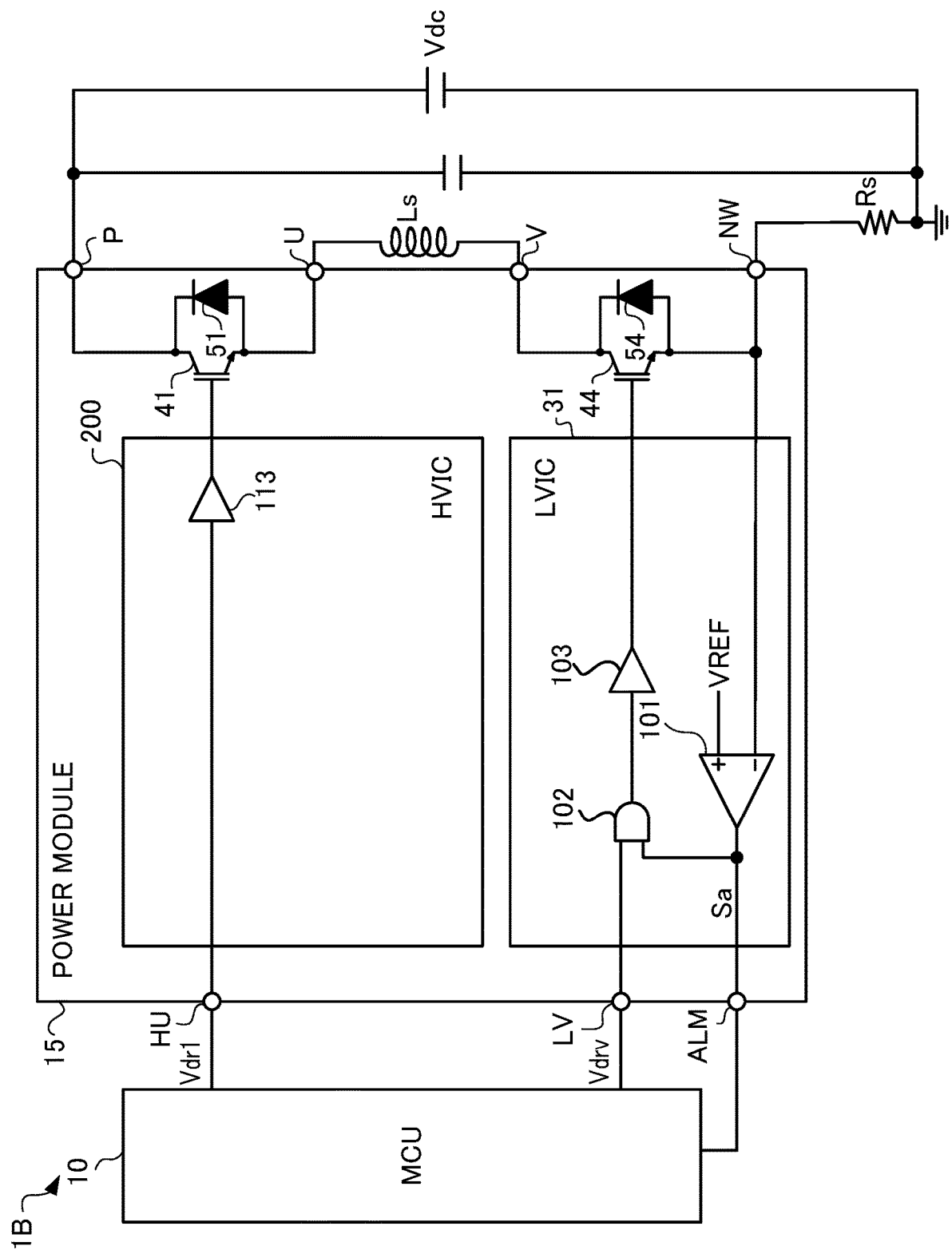
FIG. 6 is a diagram illustrating an example of a configuration of an HVIC 200.

FIG. 6 is a diagram illustrating an example of a configuration of the HVIC 200. The HVIC 200 is obtained by removing the selection circuit 110 and the delay circuit 112 from the HVIC 32. Accordingly, a description thereof is omitted.

<<<Operation of Power Module 15>>>

Figure 7:
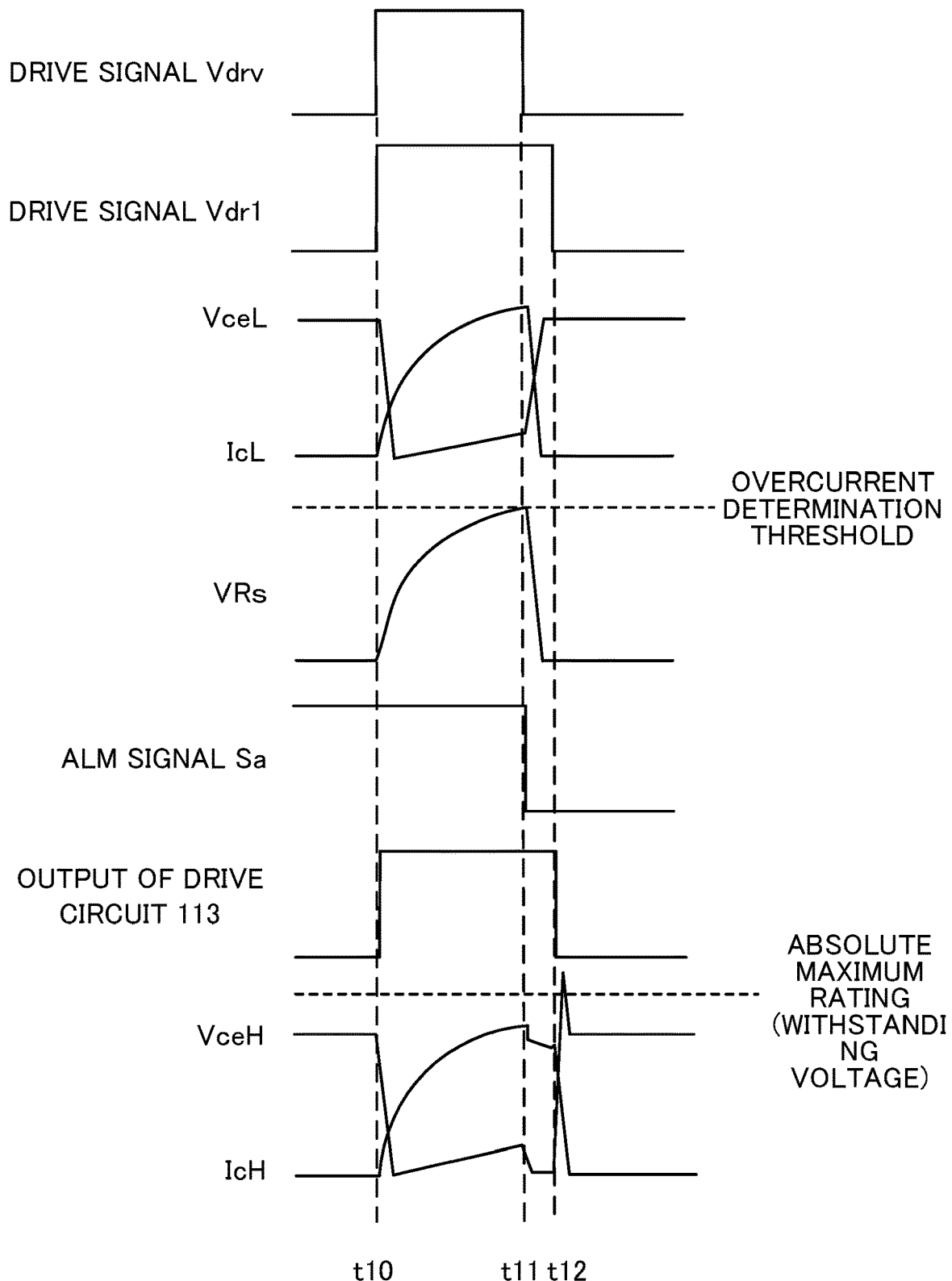
FIG. 7 is a diagram for explaining an operation of a power module 15.

FIG. 7 is a diagram for explaining an operation of a power module 15. A description of the same portions as those in FIG. 5 is omitted.

The HVIC 200 does not include the delay circuit 112 of the HVIC 32. Based on this difference, the HVIC 200 does not delay the drive signal Vdr1 for turning off the IGBT 41, for the predetermined period of time Ta.

Moreover, when the voltage VRs reaches the overcurrent determination threshold at time t11, the low ALM signal Sa is outputted to the MCU 10. When the processing time in the MCU 10 has elapsed at time t12, the MCU 10 changes the drive signal Vdr1 to low and outputs the drive signal Vdr1 to the HVIC 200.

As a result, the IGBT 41 is turned off at time t12 and the voltage VceH instantaneously exceeds the absolute maximum rating.

This may damage the IGBT 41.

<<<Explanation of Operation Concepts of HVIC 32 and HVIC 200>>>

Figure 8:
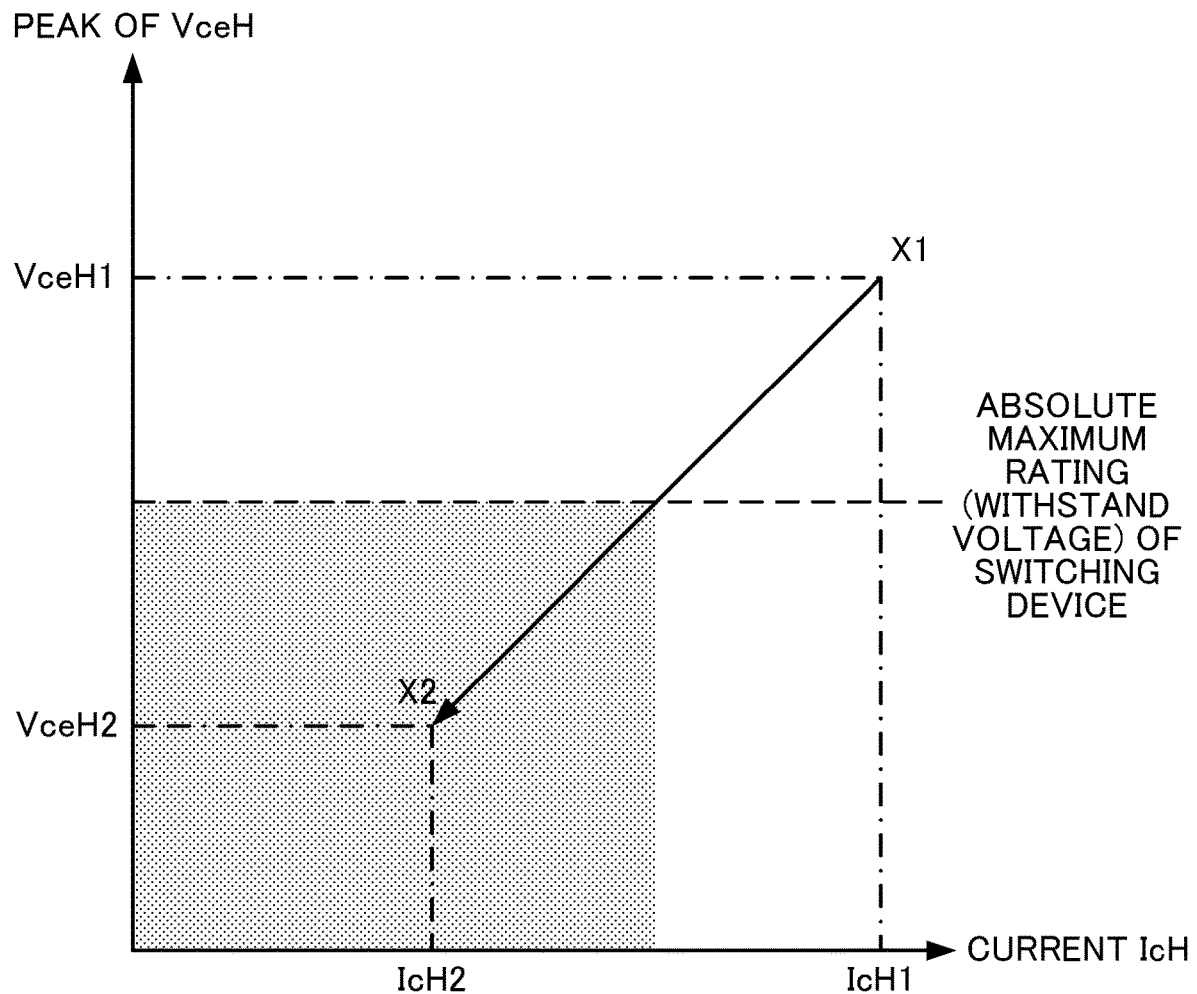
FIG. 8 is a diagram for explaining an operation concept of an HVIC 32 and an HVIC 200.

FIG. 8 is a diagram for explaining operation concepts of the HVIC 32 and the HVIC 200. The hatched portion in FIG. 8 indicates a region in which the peak of the voltage VceH does not exceed the absolute maximum rating of the switching device, in the case where the switching device is turned off in a state where the current IcH is flowing.

An operating point of the HVIC 200 is, for example, a point X1 which is outside the hatched portion. Then, the switching device is turned off at a current IcH1, and thus the peak of the voltage VceH results in a voltage VceH1 which is higher than the absolute maximum rating of the switching device.

Meanwhile, the operating point of the HVIC 32 is a point X2 which is inside the hatched portion. Thus, the current IcH in the case where the switching device is turned off results in a current IcH2 which is smaller than the current IcH1. Moreover, since the switching device is turned off at the smaller current IcH2, the peak of the voltage VceH results in a voltage VceH2 which does not exceed the absolute maximum rating of the switching device.

Modified Example

In order to operate at the point X2, the IGBT 41 is turned off after a lapse of the predetermined period of time Ta, however, it is not limited thereto.

A configuration may be such that the resistor Rs is coupled to the power supply side, and the HVIC 32 detects the overcurrent based on a voltage drop caused by the current flowing through the resistor Rs, and turns off the IGBT 41 of the upper arm.

For example, the delay circuit 112 delays the drive signal Vdr1 for turning off the IGBT 41. However, a configuration may be such that, using an IGBT (not illustrated) for sensing in addition to the IGBT 41, the IGBT of the upper arm is turned off by the drive circuit 113 upon a current of the IGBT for sensing reaching a point that is inside the hatched portion. This prevents the IGBT 41 from being damaged when the HVIC 32 turns off the IGBT 41.

Further, when a device used for the IGBT 41 is one of devices in a series with different absolute maximum ratings, the second period of time T2 may be set longer than a period of time needed for a device with the highest absolute maximum rating in the series. This eliminates the need to individually set the predetermined period of time Ta for the elements with the different absolute maximum ratings in the same series.

Figure 9:
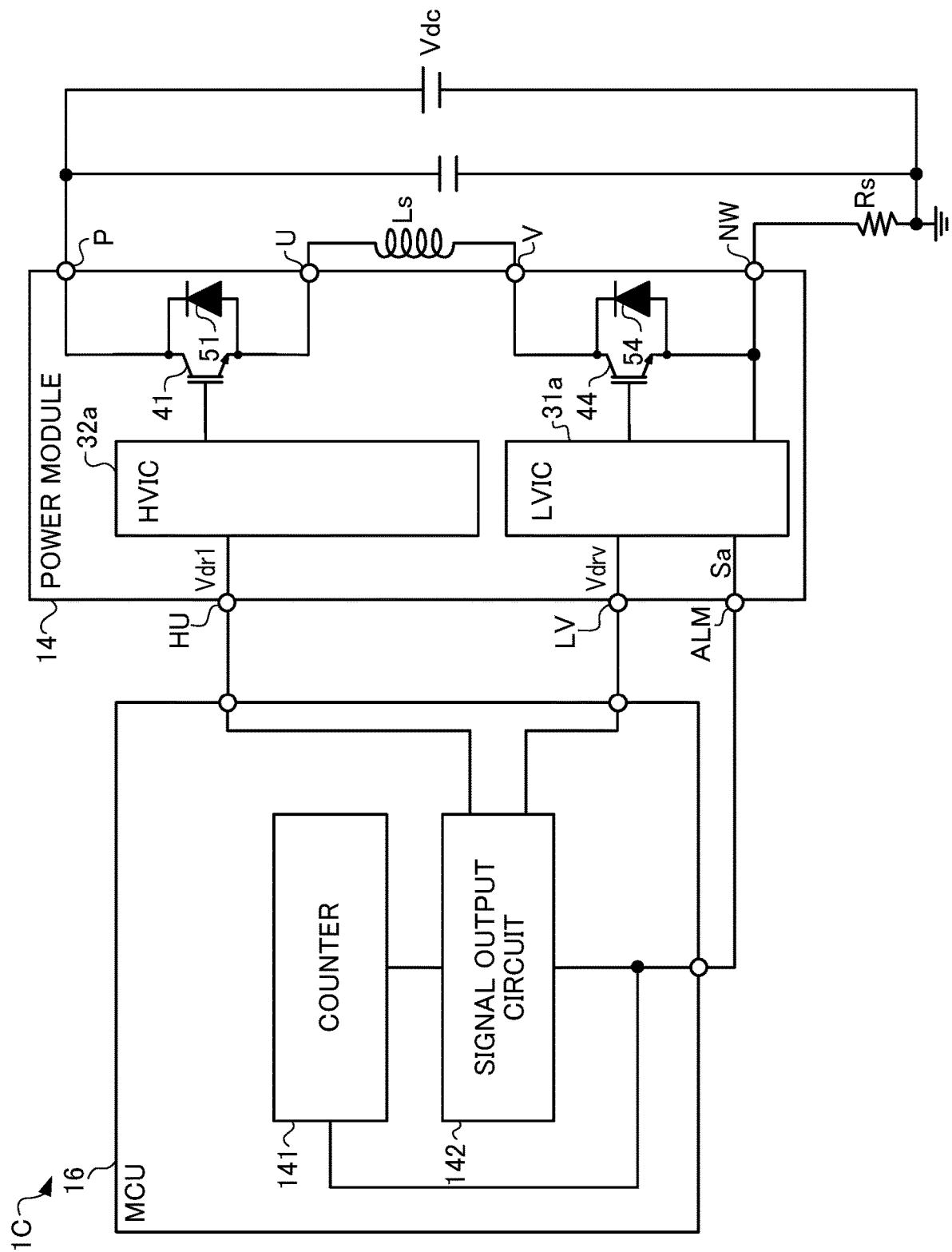
FIG. 9 is a diagram illustrating an example of a configuration of a drive control device 1C.

FIG. 9 is a diagram illustrating an example of a configuration of a drive control device 1C. An embodiment of the present disclosure described above has explained the case where the power module 11 performs control such that the IGBTs 41 and 44 are turned off. However, a control circuit 16 in the drive control device 1C may perform control such that the IGBTs 41 and 44 are turned off, as illustrated in FIG. 9. The drive control device 1C includes a power module 14 and the control circuit 16. The power module 14 includes the bridge circuit 30 for power conversion, an LVIC 31a, HVICs 32a to 34a, and terminals HU, HV, HW, LU, LV, LW, ALM, P, U, V, W, NU, NV, NW, and COM. For the sake of convenience, FIG. 9 illustrates only the LVIC 31a, the HVIC 32a, the IGBTs 41 and 44, the FWDs 51 and 54, and the terminals HU, LV, ALM, P, U, V, and NW.

The control circuit 16 includes a counter 141 and a signal output circuit 142. The counter 141 counts a predetermined period of time upon a current flowing through the IGBT 44 becoming the overcurrent. The signal output circuit 142 outputs the control signal Vdry turning off the IGBT 44 to the LVIC 31a, upon the current flowing through the IGBT 44 becoming the overcurrent, and outputs the control signal Vdr1 for turning off the IGBT 41 to the HVIC 32a, upon the predetermined period having been counted. The IGBT 41 can be prevented from being damaged also with the configuration of FIG. 9.

<<Method of Controlling Switching of IGBTs 41 and 44>>

Figure 10:
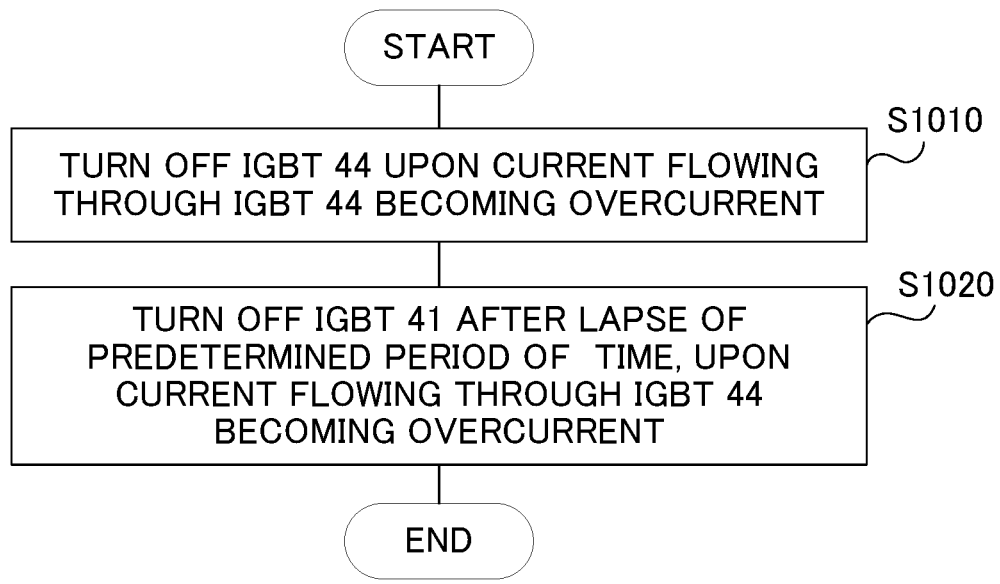
FIG. 10 is a diagram illustrating a switching control method of insulated gate bipolar transistors (IGBTs) 41 and 44.

FIG. 10 is a diagram illustrating an example of a method of turning off the IGBTs 41 and 44 that is executed by the drive control devices 1A, 1B, and 1C when the overcurrent flows through the IGBT 44.

First, upon the current flowing through the IGBT 44 becoming the overcurrent, the drive control devices 1A, 1B, and 1C turn off the IGBT 44 (S1010).

Next, upon the current flowing through the IGBT 44 becoming the overcurrent, the drive control devices 1A, 1B, and 1C turn off the IGBT 41 after a lapse of a predetermined period (S1020). As a result, the IGBT 41 can be prevented from being damaged.

SUMMARY

The power module 11 according to an embodiment of the present disclosure has been described above. After the LVIC 31 turns off the IGBT 44 of the lower arm, the HVIC 32 delays the drive signal Vdr1 for turning off the IGBT 41 of the upper arm, for the predetermined period of time Ta. This reduces the current flowing through the IGBT 41 and reduces di/dt of the overcurrent in turning-off of the IGBT 41. As a result, the peak of the voltage VceH decreases, thereby preventing the voltage VceH from exceeding the absolute maximum rating of the IGBT 41. Moreover, the HVIC 32 can prevent occurrence of avalanche breakdown of the IGBT 41. Furthermore, with the use of the HVIC 32, the power module 11 can be used as before without changing the operation of the MCU 10 or examining the functions of the power module 11 in detail by the user of the MCU 10. As such, the power module 11 using the HVIC 32 can enhance convenience for the user and also provide effects as described above.

Further, the output circuit includes the selection circuit 110 and the delay circuit 112. When the overcurrent occurs, the delay circuit 112 delays the drive signal Vdr1 for turning off the IGBT 41, for the predetermined period of time Ta, thereby providing effects as described above.

Further, the selection circuit 110 directly receives the ALM signal Sa from the LVIC 31, without the MCU 10 therebetween. This allows a signal from the lower arm to turn off the IGBT 41 when the overcurrent occurs without changing the MCU 10, thereby being able to reduce the processing load of the MCU 10.

Further, after the occurrence of the overcurrent, the LVIC 31 turns off the IGBT 44 and then the overcurrent flows through the FWD 53. With the overcurrent flowing through the FWD 53, the overcurrent is converted into heat, thereby being able to reduce the current.

Further, with the predetermined period of time Ta of the delay circuit 112 being set longer than a period of time until when the current caused by a load short-circuit falls below the overcurrent, the IGBT 41 is prevented from being damaged when the HVIC 32 turns off the IGBT 41.

Further, with the predetermined period of time Ta of the delay circuit 112 being set longer than a period of time until when the voltage applied to the IGBT 41 upon turning off of the IGBT 41 by the HVIC 32 reaches a voltage value that does not exceed the absolute maximum rating, the IGBT 41 is prevented from being damaged with reliability.

Further, the predetermined period of time Ta of the delay circuit 112 being set longer than a period of time until when the current flowing through the IGBT 41 upon turning off of the IGBT 41 by the HVIC 32 falls below the current value at which the avalanche breakdown of the IGBT 41 occurs, the IGBT 41 is prevented from being damaged.

Further, the setting of the predetermined period of time Ta of the delay circuit 112 being stored in the storage device (for example, EPROM and/or the like), the predetermined period of time Ta can be individually set according to the specifications of the IGBT 41, the purpose of use, and/or the like.

Further, the aforementioned control may also be performed by the control circuit (for example, MCU) 16.

Further, devices such as the drive control devices 1A, 1B, and 1C use the switching control method of controlling switching of the switching devices. However, devices using this method are not limited thereto.

The present disclosure can provide a switching control circuit, a drive control device, and a switching control method that are capable of preventing a switching device of an upper arm from being damaged.

Embodiments of the present disclosure described above are simply to facilitate understanding of the present disclosure and are not in any way to be construed as limiting the present disclosure. The present disclosure may variously be changed or altered without departing from its essential features and encompass equivalents thereof.

What is claimed is:

1. A switching control circuit configured to control switching of a first switching device of a bridge circuit, the bridge circuit including
   the first switching device on a power supply side thereof, and
   a second switching device on a ground side thereof and being coupled to the first switching device in series through a load,
the switching control circuit comprising:
   an output circuit configured to delay a first drive signal inputted to the switching control circuit for turning off the first switching device for a predetermined period, and output a resultant signal, when a current flowing through the second switching device becomes an overcurrent and the second switching device is turned off; and
   a drive circuit configured to drive the first switching device in response to an output of the output circuit, wherein
   the predetermined period of time is longer than at least one of
   a first period of time from when the first drive signal is inputted until when a current flowing through the first switching device falls below the overcurrent,
   a second period of time from when the first drive signal is inputted until when a voltage applied to the first switching device reaches a value that is lower than or equal to an absolute maximum rating of a voltage value of the first switching device, or a third period of time from when the first drive signal is inputted until when the current falls below a current value at which avalanche breakdown of the first switching device occurs.

2. The switching control circuit according to claim 1, wherein the output circuit includes:

a delay circuit configured to delay the first drive signal for the predetermined period and output the resultant signal; and a selection circuit configured to output the first drive signal to the delay circuit when the current becomes the overcurrent, and output a second drive signal for switching the first switching device to the drive circuit when the current is not the overcurrent.

3. The switching control circuit according to claim 1, wherein the output circuit is further configured to directly receive a signal indicating whether the current is the overcurrent, from a detection circuit configured to detect the overcurrent.

4. The switching control circuit according to claim 1, wherein the bridge circuit further includes a free wheeling diode, which is configured to allow a current flowing through the first switching device to pass therethrough upon turning off of the second switching device.

5. The switching control circuit according to claim 1, wherein the predetermined period of time is set according to a value stored in a storage device.

6. A drive control device comprising:

a first switching device on a power supply side;

a second switching device on a ground side, and being coupled to the first switching device in series through a load;

a control circuit configured to output a control signal for controlling the first switching device and the second switching device;

a high-voltage drive circuit; and a low-voltage drive circuit, wherein the high-voltage drive circuit is configured to drive the first switching device in response to the control signal, the low-voltage drive circuit is configured to drive the second switching device in response to the control signal, and the control circuit includes a counter configured to count a predetermined period of time, responsive to a current flowing through the second switching device becoming an overcurrent, and a signal output circuit configured to output the control signal for turning off the second switching device to the low-voltage drive circuit, responsive to the current becoming the overcurrent, and output the control signal for turning off the first switching device to the high-voltage drive circuit, responsive to the counter having counted the predetermined period of time.

* * * * *